United States Patent
Tsen et al.

(10) Patent No.: US 9,442,392 B2
(45) Date of Patent: Sep. 13, 2016

(54) SCANNER OVERLAY CORRECTION SYSTEM AND METHOD

(71) Applicant: TAIWAN SEMICONDUCTOR MANUFACTURING CO., LTD., Hsin-Chu (TW)

(72) Inventors: Yen-Di Tsen, Chung-Ho (TW); Yi-Ping Hsieh, Hsinchu (TW); Chen-Yen Huang, Jhunan Township (TW); Shin-Rung Lu, Chu-Pei (TW); Jong-I Mou, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/585,457

(22) Filed: Dec. 30, 2014

(65) Prior Publication Data

US 2015/0170904 A1    Jun. 18, 2015

Related U.S. Application Data

(60) Continuation-in-part of application No. 14/514,467, filed on Oct. 15, 2014, now Pat. No. 9,082,661, which is a division of application No. 13/716,340, filed on Dec. 17, 2012, now Pat. No. 8,889,434.

(51) Int. Cl.
*G03F 7/20* (2006.01)
*G03F 9/00* (2006.01)
*H01L 21/00* (2006.01)
*H01L 21/027* (2006.01)
*H01L 21/66* (2006.01)

(52) U.S. Cl.
CPC ......... *G03F 7/70633* (2013.01); *G03F 9/7003* (2013.01); *G03F 9/7019* (2013.01); *H01L 21/0274* (2013.01); *H01L 22/12* (2013.01); *H01L 22/20* (2013.01)

(58) Field of Classification Search
CPC ............. G03F 7/70633; G03F 9/7003; G03F 9/7019; H01L 21/0274; H01L 22/12
USPC .................................... 430/22, 30
See application file for complete search history.

(56) References Cited

U.S. PATENT DOCUMENTS

| | | |
|---|---|---|
| 7,704,652 B2 | 4/2010 | Hatai |
| 7,842,442 B2 | 11/2010 | Seltmann et al. |
| 8,175,831 B2 | 5/2012 | Izikson et al. |
| 2003/0223630 A1 | 12/2003 | Adel et al. |
| 2004/0029025 A1 | 2/2004 | Hommen et al. |
| 2005/0071033 A1 | 3/2005 | Cheng et al. |
| 2007/0064211 A1 | 3/2007 | Hatai |
| 2012/0022679 A1 | 1/2012 | Choi et al. |

FOREIGN PATENT DOCUMENTS

| | | |
|---|---|---|
| JP | 2004524688 | 8/2004 |
| JP | 2005518107 | 6/2005 |
| KR | 1020010065021 A | 7/2001 |
| KR | 1020050111268 A | 11/2005 |

OTHER PUBLICATIONS

Notice of Allowance issued Oct. 23, 2014 in counterpart KR patent application No. 10-2013-0020487.
Conway, T. H. et al., "Improving overlay control through proper use of multilevel query APC", Proc. SPIE 5044, Advanced Process Control and Automation, Jun. 2003, 8 pages.
Conway, T. and Crow, D. , "Controllability and Performance of Feedback Control System for Overlay," A A 1.2 (2002): 16, 4 pages.
Solid State Technology, Insights for Electronics Manufacturing, WaferSense APS, "Capabilities and Lessons from 10 Years of APC Success", retrieved from http://www.electroiq.com/articles/sst/print/volumne-47/issue-2/features/advanced-process, Oct. 2012.

*Primary Examiner* — Christopher Young
(74) *Attorney, Agent, or Firm* — Duane Morris LLP; Steven E. Koffs

(57) ABSTRACT

A method of processing first and second semiconductor wafers is provided. Each of the first and second semiconductor wafers has a first layer and a second layer over the first layer. A first lithographic process is performed on the first layer over the first semiconductor wafer using a first inter-field correction and a first intra-field correction. An overlay error of the first lithographic process is determined. A second inter-field correction and a second intra-field correction are computed based on the first inter-field correction, the first intra-field correction, and the measured overlay error. A second lithographic process is performed on the second layer over the second semiconductor wafer, based on the second inter-field correction and the second intra-field correction.

20 Claims, 14 Drawing Sheets

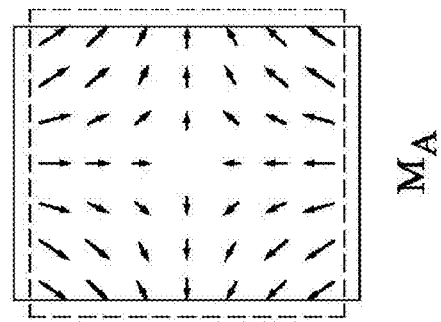
FIG. 2H  $M_A$
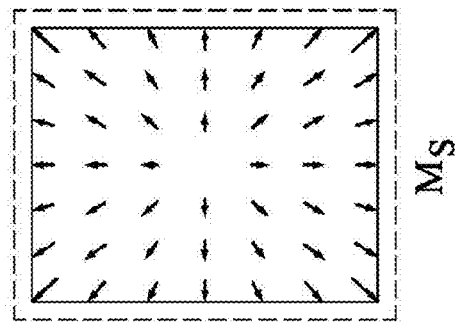
FIG. 2G  $M_S$
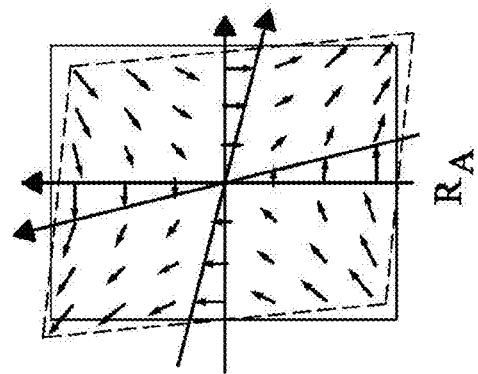
FIG. 2F  $R_A$
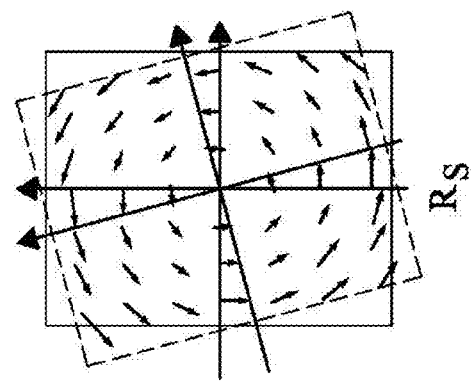
FIG. 2E  $R_S$

SCANNER OVERLAY CORRECTION SYSTEM AND METHOD

PRIORITY CLAIM AND CROSS-REFERENCE

This application is a continuation-in-part of U.S. patent application Ser. No. 14/514,467, filed Oct. 15, 2014, which is a division of U.S. patent application Ser. No. 13/716,340, filed Dec. 17, 2012, now U.S. Pat. No. 8,889,434, which are expressly incorporated by reference herein in their entireties.

BACKGROUND

This disclosure relates generally to semiconductor processing and more specifically to scanner equipment used in photolithography. Lithography is widely used in integrated circuit (IC) fabrication. A material layer is deposited on a wafer. A masking material is formed over the material layer and exposed in a pattern to form a hard mask for etching. Portions of the material layer which are not covered by the mask are then etched to form one or more patterns (e.g., trenches) that are filled with conductive material (e.g., copper) and planarized to form circuit paths. Another material layer is deposited over the patterned first material layer and the process is repeated to pattern the second layer. This process is repeated many times.

To ensure proper connectivity and performance, the patterns in adjacent layers are aligned properly with each other. Alignment marks (e.g., boxes) are used to align each added layer to the previously formed layer.

To maintain proper alignment between layers, a form of run-to-run control referred to as advance process control (APC) is used. Alignment errors are monitored. From time to time, an operator inputs a correction (e.g., a translation, rotation or scaling correction) to the scanning exposure tool, perhaps weekly or monthly. This correction is applied to compensate for the condition causing the misalignment.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2E-2H are diagrams showing the parameters of an exemplary intra-field overlay model, in accordance with some embodiments.

DETAILED DESCRIPTION

Figure 1:
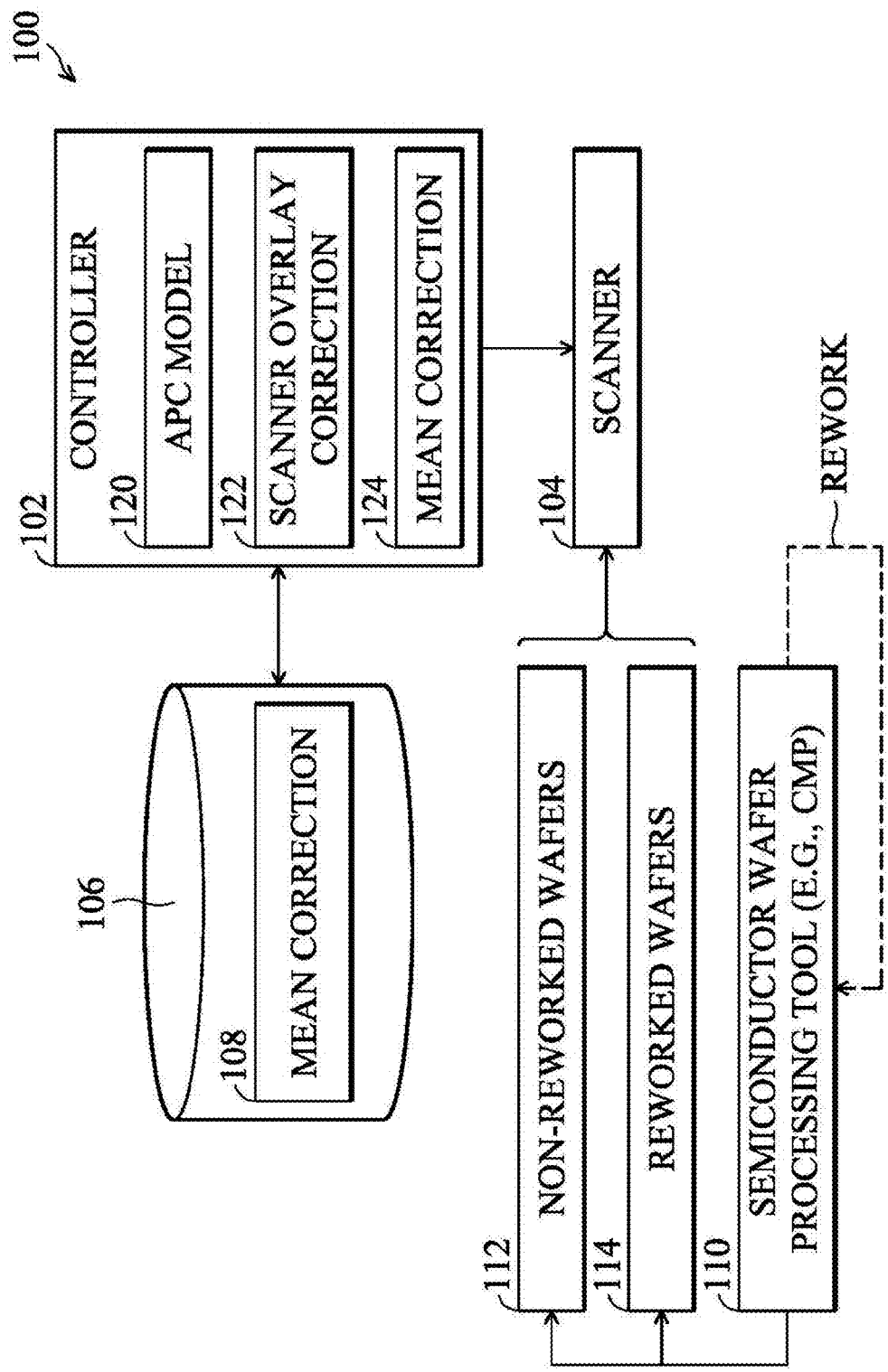
FIG. 1 is a block diagram of a system for controlling a scanner, in accordance with some embodiments.

The following disclosure provides many different embodiments, or examples, for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

This description of the exemplary embodiments is intended to be read in connection with the accompanying drawings, which are to be considered part of the entire written description.

FIG. 1 is a schematic block diagram of an example of a system 100. A photo tool 104 is provided for performing photolithographic exposure. In some embodiments, the photo tool 104 is a stepper. A stepper passes light through a mask or reticle, forming an image of the reticle pattern. The image is focused and reduced by a lens, and projected onto the surface of a semiconductor substrate that is coated with a photoresist. The stepper translates or "steps" the wafer from one field or shot location to another, by moving the wafer back and forth under the lens of the stepper.

In some embodiments, the photo tool 104 is a scanner. Scanners are steppers that move the reticle stage and wafer stage in opposite directions relative to each other during the exposure. Instead of exposing the entire field at once, the exposure is made through an aperture that is as wide as the exposure field, but only a fraction of its length. The image from the aperture is scanned across the exposure area. Although reference is made below to an example of a scanner, the techniques described below with reference to scanner 104 can also be applied to other types of steppers.

A controller 102 controls operation of the scanner. The controller 102 includes an advanced process control (APC) model 120, a scanner overlay correction module 122 and a mean correction module 124. In some embodiments, the controller 102 comprises a general purpose processor programmed to perform the computations described herein. The general purpose processor can be a computer or an embedded processor or microcontroller. In some embodiments, the controller comprises application specific integrated circuitry (ASIC) for performing the functions described herein.

The controller 102 has read and write access to a non-transitory, machine readable storage medium 106 which has been encoded to store one or more mean correction values to be used for applying respective offset(s) to one or more exposure parameters used by the scanner 104.

In some embodiments, the controller contains a scanner overlay correction module 122 corresponding to the scanner. The scanner overlay correction module includes an adjustment for wafer rotation, an adjustment for wafer non-orthogonality and an adjustment for wafer scaling coefficients. In other embodiments, other exposure parameters are used, such as one or more of the group consisting of wafer rotation, wafer non-orthogonality and wafer scaling coefficients.

The mean correction module 124 of controller 102 is configured to determine whether a semiconductor substrate to be exposed by a scanner has been subjected to a specific process or step, such as a rework process. In some embodiments, the mean correction module 124 identifies substrates as belonging to either a first group 112 that has undergone a first set of fabrication processes, or a second group 114 that has undergone a second set of fabrication processes differing in some respect from the first set of fabrication processes.

A non-transitory, machine readable storage medium 108 contains a mean correction value to be applied to the scanner for exposing the semiconductor substrate if the semiconductor substrate has been subjected to the rework process. The mean correction module 124 applies the mean correction value(s) 108 when controlling the scanner 104 to expose the substrates in the second group 114, but not when controlling the scanner 104 to expose the substrates in the first group 112.

The system further comprises one or more semiconductor fabrication tools 110, such as a CMP tool. The tool(s) 110 provide a first plurality of wafers belonging to the first group 112 and a second plurality of wafers belonging to the second group 114. For example, in some embodiments, the tool 110 is a CMP tool. Wafers in the first group 112 are planarized by the tool 110 and pass inspection without undergoing rework. Wafers in the second group 114 do not immediately pass all acceptance criteria, and are thus subjected to a CMP rework process.

The mean correction module 124 of controller 102 is configured to control the scanner 104 using a scanner overlay correction. The controller is further configured to apply the mean correction value to adjust an exposure parameter of the scanner if the semiconductor substrate to be exposed by the scanner has been subjected to the rework process. The controller is configured to control the scanner to expose substrates, on which the rework process has not been performed, without using the mean correction.

In some embodiments, the mean correction module 124 of the controller 102 is configured to compute the mean correction as a difference between: a mean of the exposure parameter among a first plurality of substrates that have been processed by the semiconductor fabrication process and the rework process, and a mean of the exposure parameter among a second plurality of substrates that have been processed by the semiconductor fabrication process but not the rework process.

The inventors have determined that subjecting a substrate to a rework process can physically alter a characteristic (e.g., thickness) of the substrate which is relevant to the APC model. Thus, in some embodiments, the controller 102 controls the scanner 104 to apply an additional correction to the second group of substrates 114. In some embodiments, this correction is uniformly applied as a constant adjustment across all the substrates in the second group 114. This additional correction is not applied to the substrates in the first group 112.

In some embodiments, the semiconductor fabrication process is a chemical mechanical polishing (CMP) process performed on a layer of one of the first plurality of substrates, and the rework process is a CMP rework process performed on the same layer of the one substrate. In some embodiments, the exposure parameter includes: a first wafer scaling coefficient $S_X$ for a first direction; and a second wafer scaling coefficient $S_Y$ for a second direction orthogonal to the first direction.

Each scanner has an APC model 120, which can be defined by the manufacturer of the scanner. FIGS. 2A to 2H show a plurality of conditions that are included in the APC model 120 in some embodiments.

Figures 2A, 2B, 2C, 2D:
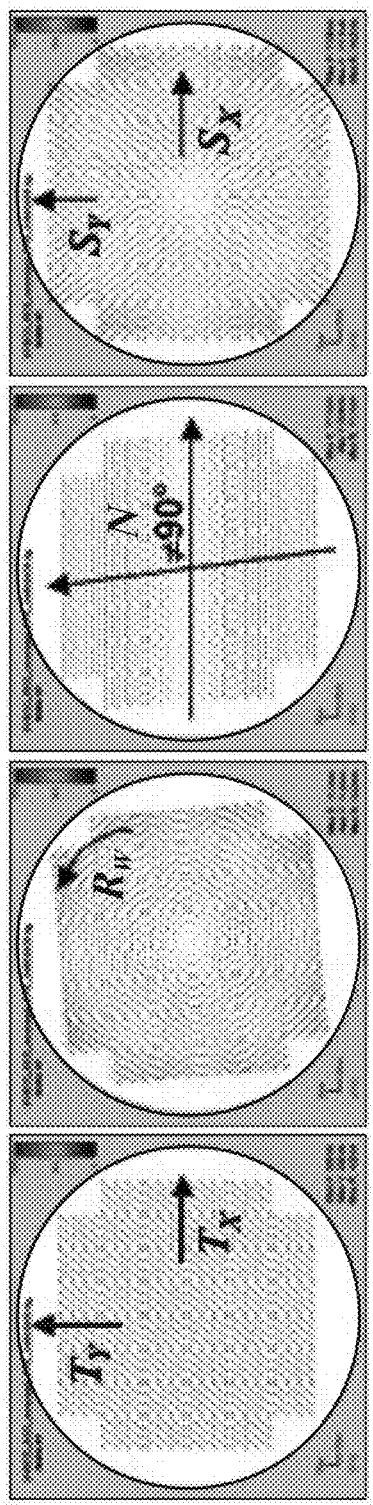
FIGS. 2A-2D are diagrams showing the parameters of an exemplary inter-field overlay model, in accordance with some embodiments.

FIGS. 2A-2D show factors in the inter-field model. These factors are uniformly applied within a field, and result in a deviation between a location in one field and the corresponding location in an adjacent field. FIG. 2A shows inter-field X and Y direction translations $T_X$ and $T_Y$, respectively. FIG. 2B shows inter-field wafer rotation RW. FIG. 2C shows non-orthogonality (whereby a right angle in one field is transformed into an acute or obtuse angle in another field) FIG. 2D shows scaling coefficients $S_X$ and $S_Y$, respectively (which result in one field or shot being elongated or compressed in X and/or Y directions relative to an adjacent field or shot).

In some embodiments, the Inter-field Model is given by:

$$dx = T_X - (RW+N)*Y + S_x*X + \text{higher order terms} \quad (1)$$

$$dy = T_Y + Rw*X + S_Y*Y + \text{higher order terms} \quad (2)$$

wherein
(X,Y) are inter-field coordinate system, with respect to the center of the wafer,
dx, dy are inter-field overlay errors,
$T_X$, $T_Y$ are inter-field translations,
RW is wafer rotation,
N is non-orthogonality and
$S_X$, $S_Y$ are wafer scaling coefficients, and
The higher order terms can be ignored.

FIGS. 2E-2H show factors in the intra-field model. FIG. 2E shows a symmetric rotation. FIG. 2F shows an asymmetric rotation. FIG. 2G shows a symmetrical magnification. FIG. 2H shows an asymmetrical magnification.

In some embodiments, the intra-field model is given by:

$$dx = T_x - (RS+RA)*y + (MS+MA)*x + \text{higher order terms} \quad (3)$$

$$dy = T_y + (RS-RA)*x + (MS-MA)*y + \text{higher order terms} \quad (4)$$

where:

(x,y) is the intra-field coordinate system, with respect to the center of a field, dx,dy are intra-field overlay errors, $T_x$, $T_y$ are intra-field translations, RS, RA are symmetrical and asymmetrical field rotations, and MS, MA are symmetrical and asymmetrical field magnifications.

Figure 3:
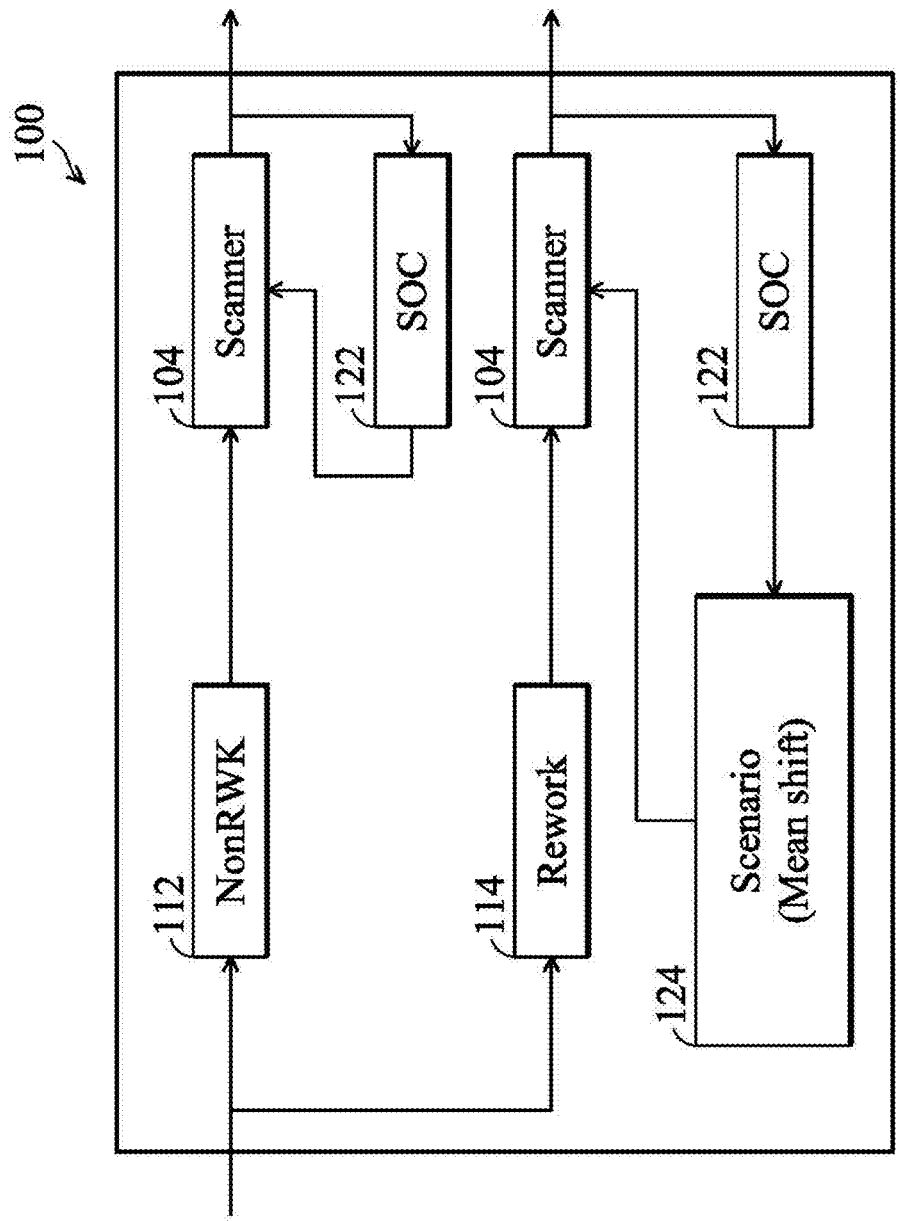
FIG. 3 is a schematic diagram of the APC controller of FIG. 1, in accordance with some embodiments

FIG. 3 is a schematic functional diagram of the control apparatus 100.

Wafers 112 in the first processing group (e.g., wafers which have not undergone a CMP rework process) are exposed in the scanner 104 using scanner overlay correction 122.

Wafers 114 in the second processing group (e.g., wafers which have undergone a CMP rework process) are also exposed in the scanner 104 using scanner overlay correction 122. However, an additional adjustment is made to the scanner to compensate for the effect of the rework.

Although FIG. 3 conceptually shows separate processing of the first group 112 and second group 114 of substrates, both groups can be processed in the same scanner 104. In some embodiments, all of the first group 112 of substrates are exposed in a first batch, and then all of the second group 114 of substrates are exposed in a second batch. In other embodiments, the two groups 112 and 114 of substrates can be intermingled.

Figure 5:
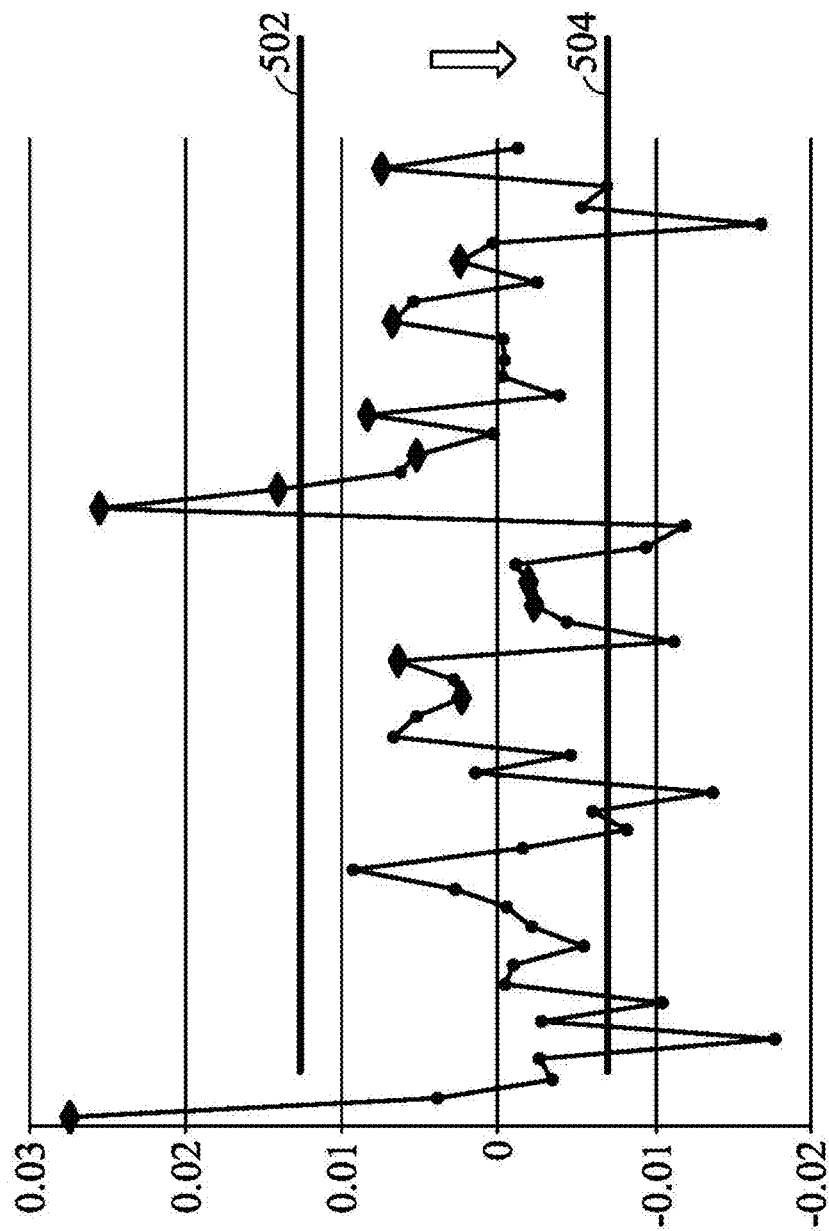
FIG. 5 is a diagram of overlay error data without a mean correction, in accordance with some embodiments.
Figure 6:
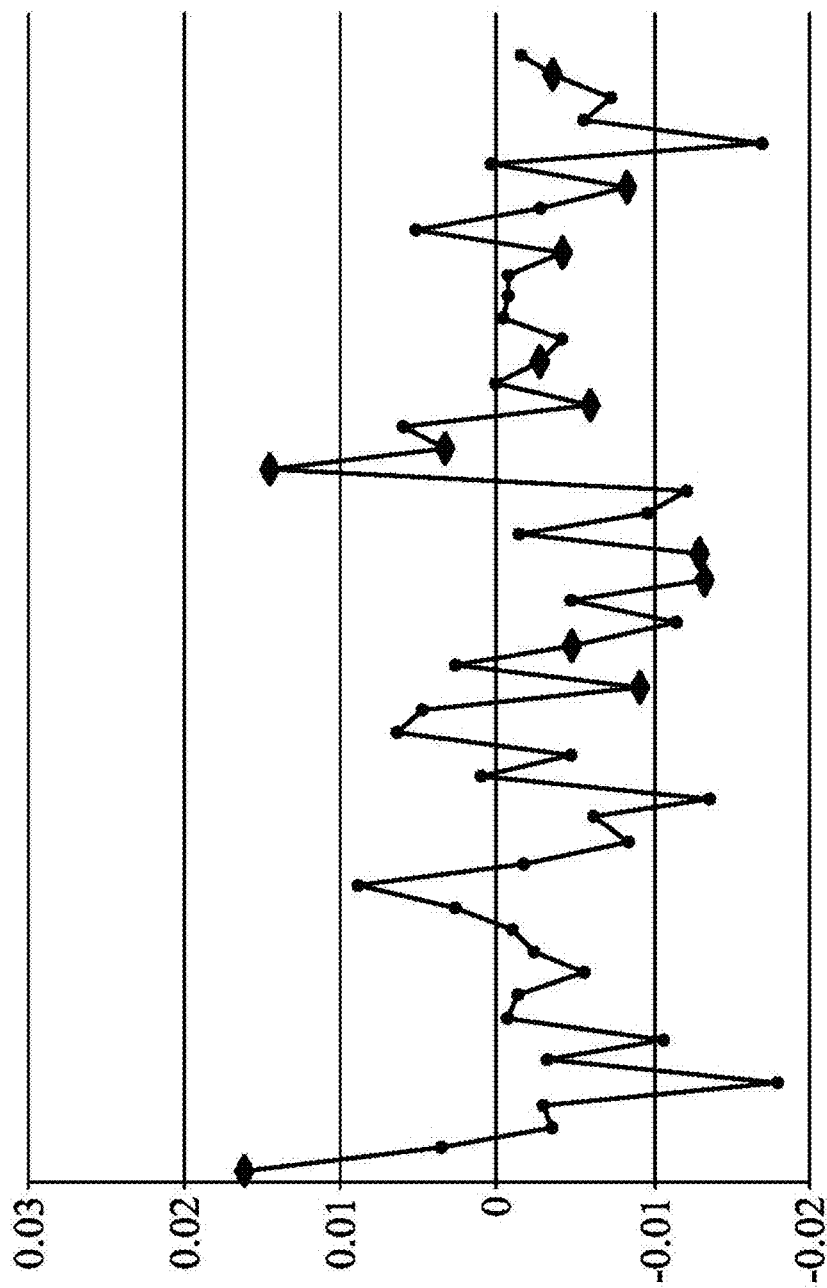
FIG. 6 is a diagram of overlay error data with a mean correction for reworked wafers, in accordance with some embodiments.

FIGS. 5 and 6 show an example of the impact of the mean correction. In both FIG. 5 and FIG. 6, the Y (vertical) axis represents the overlay error, and the various X (horizontal) axis locations represent different data points corresponding to wafers processed in time sequence. In this example, the overlay error (Y axis) corresponds to error in $S_x$, the wafer scaling coefficient in the X direction.

In FIG. 5, the values of one of the above listed exposure parameters for the first group 112 of wafers is represented by circles, and corresponding values for the second group 114 of wafers is represented by diamonds. The mean 502 of the overlay errors for the second (reworked) group is substantially greater than the mean 504 of the overlay errors for the first (non-reworked) group.

In some embodiments, for a CMP rework operation, the deviations in the overlay error correspond to a shift in the mean wafer scaling coefficients $S_X$, $S_Y$. Thus, in controlling the operation of the scanner 104, the values of $S_X$ and $S_Y$ are adjusted by the mean value observed among reworked wafers during the previous rework operations, so as to compensate for the rework-effect when exposing a new plurality of reworked wafers 114 in the scanner 104.

In FIG. 6, a mean shift (corresponding to the difference in the means of an exposure parameter between the non-reworked and reworked substrates) is added to the scanner overlay correction model for the reworked substrates. For example, in some embodiments, a mean shift is added to the $S_X$ and $S_Y$ terms of equations (1) and (2), above for each of the reworked wafers. As a result, the difference in overlay error between the non-reworked and pre-processed (e.g., reworked) substrates is effectively eliminated.

In other embodiments, for which the model of equations (1) to (4) apply, other combinations of one or more of the parameters $T_X$, $T_Y$, RW, N, $S_X$ and $S_Y$ of the inter-field model or $T_x$, $T_y$, RS, RA, MS, and MA of the intra-field model are adjusted according to respective differences between the respective means of the non-reworked wafers and the means of the reworked wafers. In other embodiments, the scanner 104 operates according to different scanner overlay control error models, and an appropriate mean shift is implemented.

Although an example above assigns substrates to groups according to whether or not the wafer has undergone CMP rework, the method can be applied for other groupings. For example, in some embodiments, the first group of substrates have not undergone photo rework, and the second group of substrates have undergone photo rework. In other embodiments, the first group and second group differ from each other with respect to whether a processing step (other than rework) is performed prior to exposing the substrate in the scanner 104.

Figure 4:
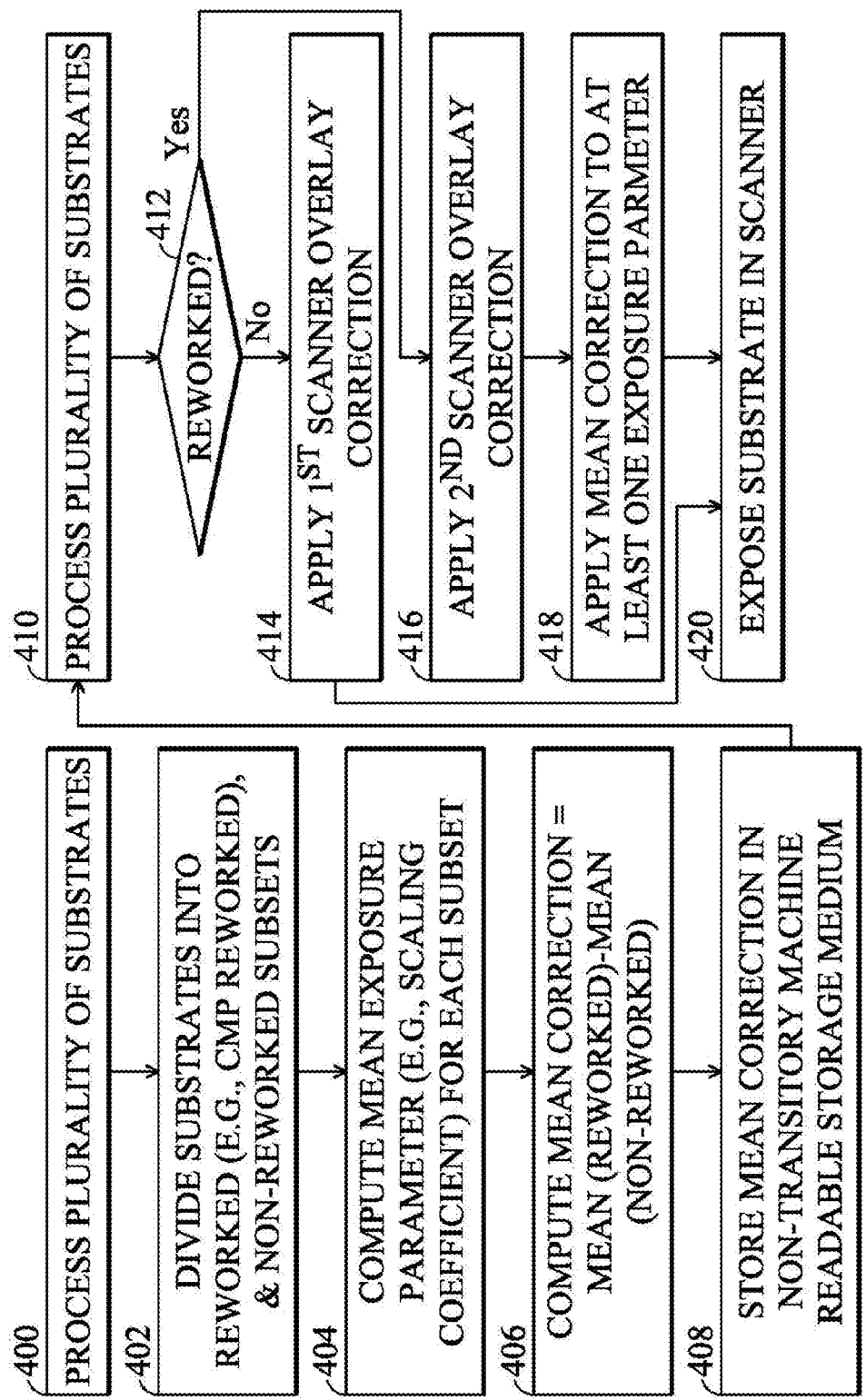
FIG. 4 is a flow chart of a method for controlling the scanner of FIG. 1, in accordance with some embodiments.

FIG. 4 is a flow chart of an exemplary process.

In step 400, a plurality of semiconductor substrates that have been processed by a semiconductor fabrication process are provided for exposure by a stepper, such as a scanner.

At step 402, the substrates are divided or assigned according to whether the substrates have received special processing. For example, in some embodiments, the substrates are divided into a group that has been reworked (e.g., CMP rework or photo rework), and a group that has not been reworked. The non-reworked substrates are assigned to a first plurality of semiconductor substrates that have not been processed by the semiconductor fabrication process and a rework process. The reworked substrates are assigned to a second plurality of semiconductor substrates that have been processed by the semiconductor fabrication process and a rework process.

At step 404, a respective mean exposure parameter (e.g., a scaling coefficient SX, SX) is computed for each individual one of the first and second subsets.

At step 406, a mean correction value 108 is computed for each of the exposure parameters that is substantially affected by the differential processing. For example, in some embodiments where the second group of substrates is subjected to an additional step or process that changes a thickness of a layer of the substrate, the scaling coefficients $S_X$, $S_Y$ are affected. Thus, an X mean shift is computed by subtracting the mean $S_X$ of the substrates in the second group from the mean $S_X$ in the first group. Similarly, the Y mean shift is computed by subtracting the mean $S_Y$ of the substrates in the second group from the mean $S_Y$ in the first group. This is just one example. If the first and second groups differ by a different process or step (other than CMP rework) that affects the second group but not the first, then the mean shift of one or more different parameters of the model are computed.

At step 408, the mean correction value(s) 108 is (are) stored in a non-transitory, machine readable storage medium, for subsequent use. In some embodiments, this stored value 108 is automatically forwarded to the controller 100. In other embodiments, a user reads the correction value 108 from the medium 106 and manually enters the value 108 in the controller.

At step 410, a plurality of substrates are processed by a process or step that is performed prior to an exposure step on the scanner 104. In some embodiments, this is the same set of substrates processed in step 400 (and used to compute the mean correction in step 406), but the correction is to be applied to a different layer than the layer processed in step 400. In some embodiments, the substrates processed in step 410 are not the same substrates processed in step 400, but the exposure process in the scanner is controlled using the mean correction computed in step 406 (based on the empirical data fed back from the processing in step 400). For example, the additional wafers can include a third plurality of substrates, on which a rework process has not been performed, and a fourth plurality of substrates, on which a rework process has been performed.

At step 412, a determination is made whether the substrate to be processed is reworked or not reworked. In some embodiments, this determination is made on a group by group basis. In other embodiments, this determination is made on an individual substrate basis. If the substrate(s) to be processed are not reworked, step 414 is performed next. If the substrate(s) to be processed are reworked, step 416 is performed next.

At step 414, a first scanner overlay correction is applied to the scanner for exposing the first plurality of (non-reworked) substrates. Then step 420 is performed next.

At step 416, a second scanner overlay correction is applied to the scanner for exposing the second plurality of (reworked) substrates. In some embodiments, the first and second scanner overlay corrections are the same as each other.

At step 418, the mean correction value 108 stored in the storage medium 106 is applied to the scanner for exposing the second plurality of substrates.

At step 420, the scanner exposes the substrate(s) using the applied settings. Thus, for example, a new (third) plurality of substrates, on which the rework process has not been performed, can be exposed, without using the mean correction 108. Meanwhile, a new (fourth) plurality of substrates, on which the rework process has been performed, can be exposed, using the mean correction 108.

As described herein, the pre-processing effects of rework, film thickness, range and out-of-specification values can be eliminated by the combination of overlay APC with scanner overlay correction and mean shift correction. When the mean shift is added to the overlay APC for reworked substrates, these pre-processing effects are reduced or eliminated. Based on simulations, the standard deviation of overlay errors can be reduced by about 14 to 18% by using the mean correction for reworked substrates.

In some embodiments, a method comprises: (a) providing a first plurality of semiconductor substrates that have been processed by a semiconductor fabrication process; (b) providing a second plurality of semiconductor substrates that have been processed by the semiconductor fabrication process and a rework process; (c) applying a first scanner overlay correction to expose the first plurality of substrates; and (d) applying a second scanner overlay correction and a mean correction to expose the second plurality of substrates.

In some embodiments, a method comprises: (a) performing a semiconductor fabrication process on a plurality of substrates; (b) after step (a), dividing the plurality of substrates into a first subset and a second subset; (c) performing a rework process on the second subset of the plurality of substrates but not on the first subset; (d) computing a respective mean value of at least one exposure parameter for a lithography process for each respective one of the first and second subsets of the plurality of substrates; and (e) applying a scanner overlay correction and a mean correction to expose a second plurality of substrates on which the rework process has been performed, the mean correction being based on the mean values from step (d).

In some embodiments, control apparatus comprises: a controller configured to determine whether a semiconductor substrate to be exposed by a scanner has been subjected to a rework process. A non-transitory, machine readable storage medium contains a mean correction value to be applied to the scanner for exposing the semiconductor substrate if the semiconductor substrate has been subjected to the rework process. The controller is configured to control the scanner using a scanner overlay correction. The controller is further configured to apply the mean correction value to adjust an exposure parameter of the scanner if the semiconductor substrate to be exposed by the scanner has been subjected to the rework process.

The present disclosure further provides a method, system and non-transitory machine readable storage medium for computing both inter-field and intra-field APC control actions that are optimized for each lot of semiconductor wafers processed, without requiring collection of intra-field overlay error data from every lot. In some embodiments, the scanner controller 1102 (FIG. 11) uses feed-forward (FF) control (based on overlay measurements from the first lot) for overlay (OVL) correction per exposure (CPE). Some embodiments also provide OVL correction per exposure based on a model that accounts for the APC correction used in the adjacent (most recent) previous layer of each previous lot. Some embodiments provide OVL correction per exposure based on a model that accounts for the APC correction used in each previous lot.

Figure 7:
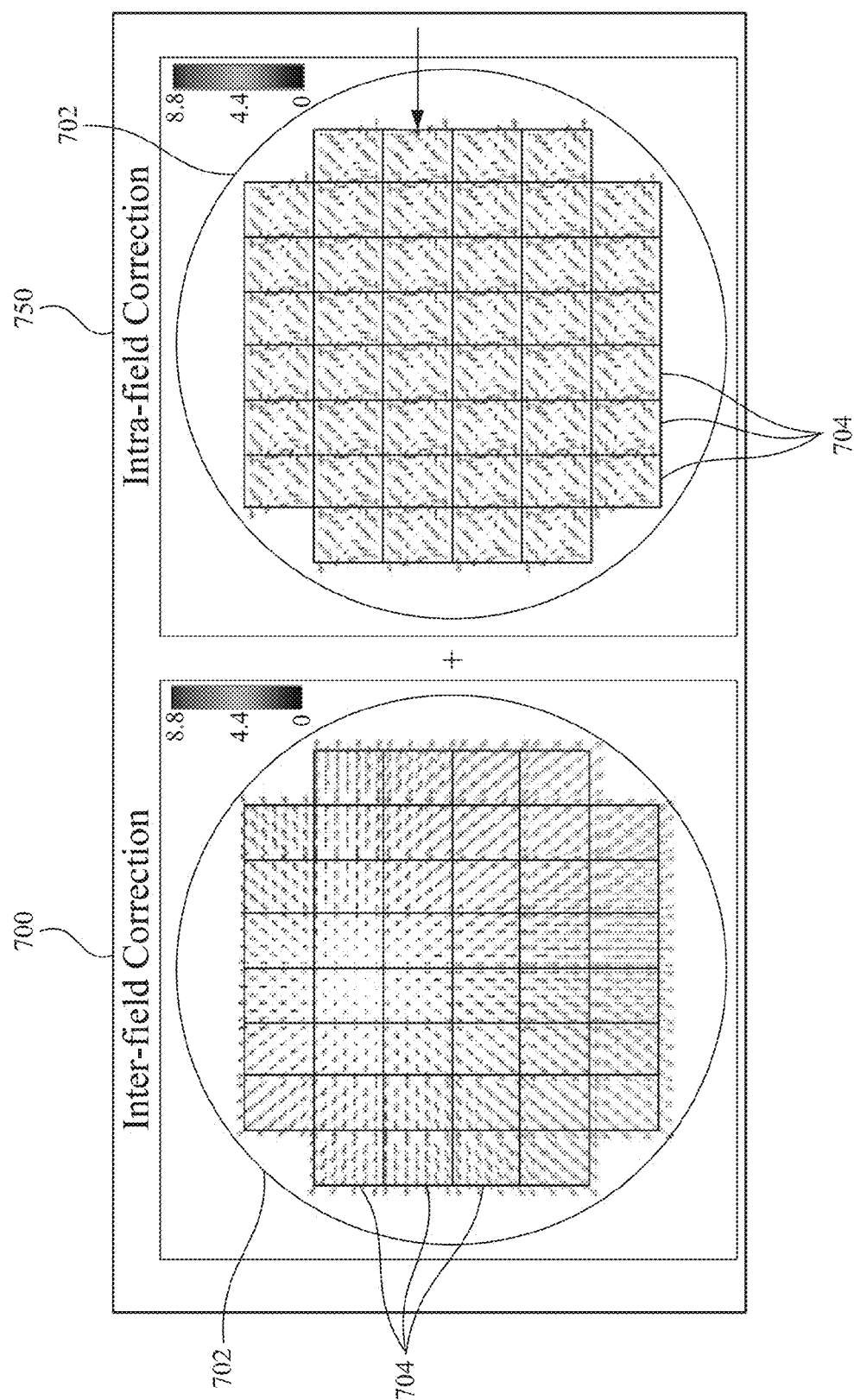
FIG. 7 is a diagram comparing inter-field correction and intra-field correction, in accordance with some embodiments.

FIG. 7 is a diagram showing inter-field correction 700 and intra-field correction 750 for a wafer 702. The wafer 702 has a plurality of dies 704. A photolithographic tool, such as a scanner 104 patterns a plurality of fields on the wafer 702. Each field patterns a respective layer on each die 704. The inter-field correction 700 compensates for wafer level deviations between target critical dimensions (CD) and actual CD, due to the position of each die relative to a reference location (e.g., the center of the wafer). Thus, the inter-field correction can include a combination of one or more of the group consisting of translations, rotations, scaling, and non-orthogonality. The inter-field correction applied to each field is different, and can be a computed as a linear function of the location of each die 704 on the wafer.

The intra-field correction 750 is the same for each field (die) 704 on the wafer 702. To determine the intra-field offset, many measurements are collected from each die 704 in a sample. The sample can include a large number of dies in at least one wafer. In some embodiments, the sample includes at least 30 dies in a single wafer. In some embodiments, the sample includes many dies (e.g., 30 or more dies) on many wafers within a single lot. Because collecting sufficient measurement data to compute the intra-field overlay offset involves a great deal of time, it is advantageous to collect the measurement data for a small subset of the lots of semiconductor wafers. According to some embodiments of this disclosure, the intra-field correction applied to each individual lot of semiconductor wafers is optimized for that lot, even if the sample does not include any intra-field overlay offset measurements from that lot.

Figure 8:
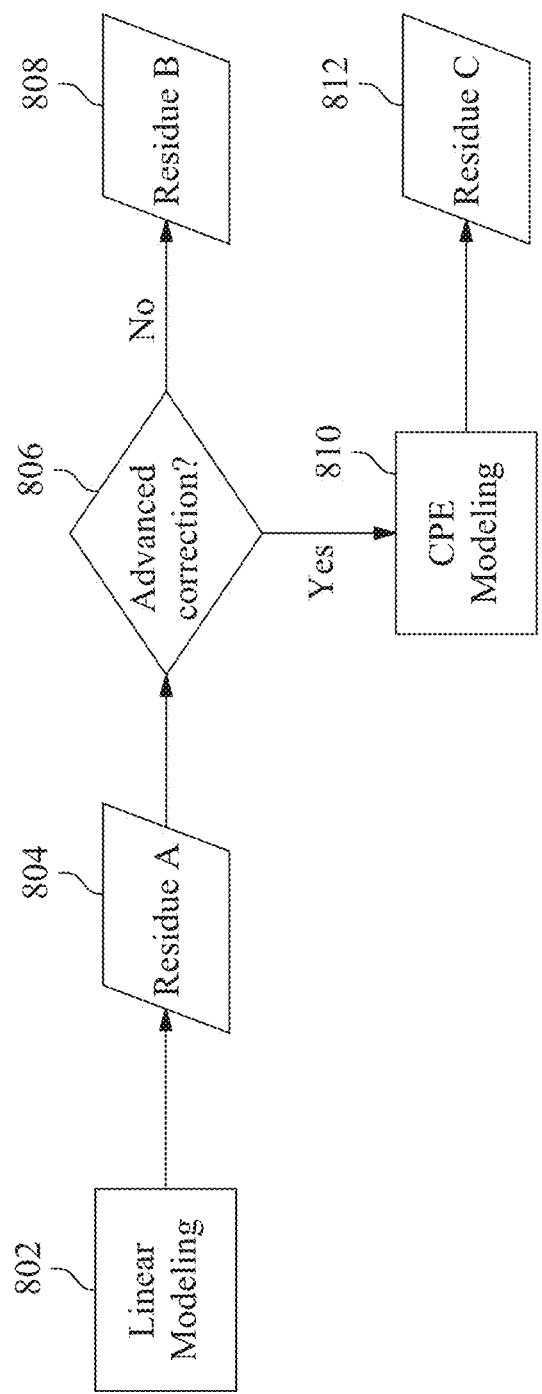
FIG. 8 is a diagram showing the computation of inter-field and intra-field offset to be compensated, in accordance with some embodiments.

FIG. 8 is a diagram showing a computation for separation of a measured or computed overlay offset into an inter-field offset and an intra-field offset.

At block 802, the controller uses linear modeling to determine an overlay offset model. The measurements collected from a first lot of semiconductor wafers are input to a regression algorithm. First, for each CD or parameter measured across multiple dies or wafers, the mean and standard deviation are computed. Then the 3-sigma (three times the standard deviation) values of the measured CDs/parameters are computed. The controller subjects the measured differences between the target CDs and the 3-sigma (three times the standard deviation) values of the measured CDs to a regression, and determines the best-fit translation, rotation, non-orthogonality and scaling for transforming the target data into the 3-sigma values of the measurement data.

At block 804, Residue A is computed. Residue A is a matrix of deviation data. For each CD or parameter measured in the sample, Residue A provides the difference between the target and the 3-sigma value of the measurement data At block 806, if advanced correction is used, blocks 810 and 812 are executed. If advanced correction is not used, block 808 is executed.

At block 808, then Residue B is used as the inter-field correction. Residue B is the inter-field offset matrix. Residue B can be computed each time the overlay error data are measured. In some embodiments, the overlay error data are measured for a each of the lots for determining inter-field correction (which uses less time than collecting data for intra-field correction).

At block 810, for advanced correction, the controller 1102 implements correction per exposure (CPE) modeling. An intra-field correction model is used to apply individual corrections within each field (die 704) of each wafer 702.

At block 812, Residue C is computed for each lot, where Residue C identifies an individual intra-field correction for each individual lot.

Figure 9A:
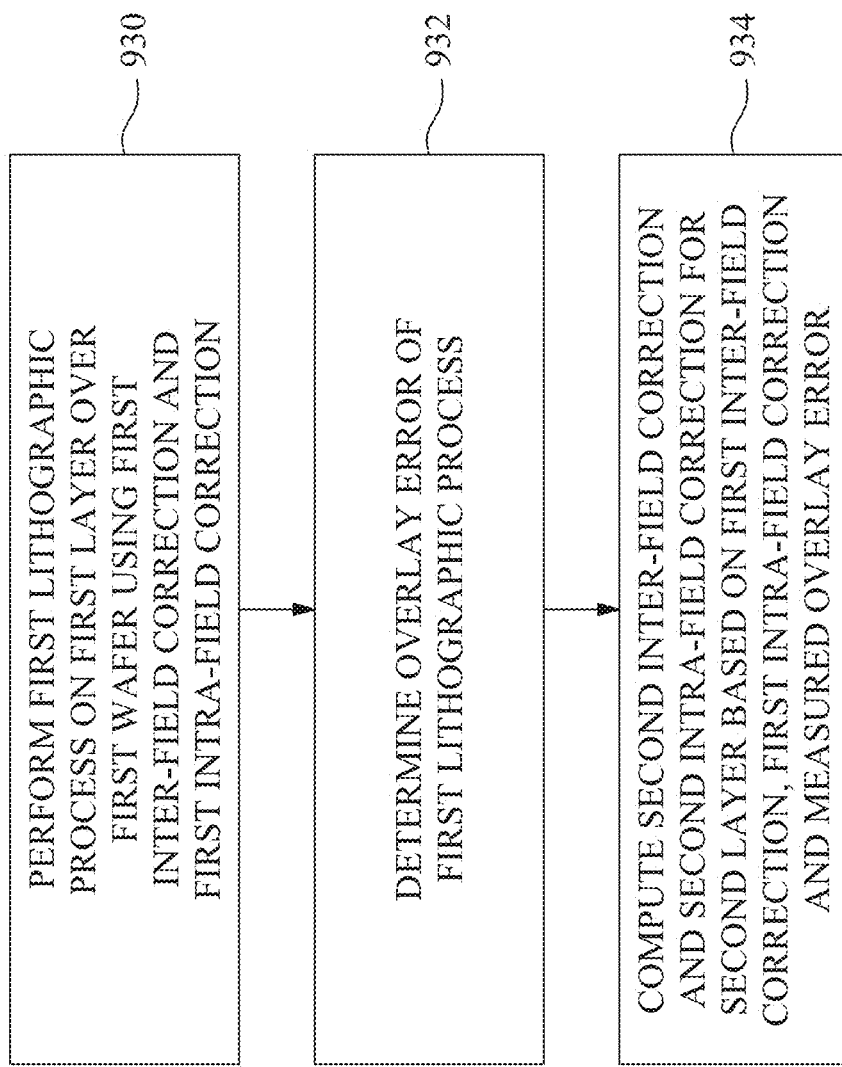
FIG. 9A is a flow chart of a method of computing inter-field and intra-field correction, in accordance with some embodiments.

FIG. 9A is a flow chart of a method according to some embodiments. The method includes processing of first and second semiconductor wafers. In some embodiments, the first wafer is included in a first lot of wafers, and the second wafer is included in a second lot of wafers processed after the first lot of wafers. Each of the first and second wafers has a first layer above a substrate, and a second layer over the first layer. For example, in some embodiments, the first layer is an active region of a semiconductor wafer, also referred to as an oxide definition (OD) region, and the second layer is the gate polycrystalline silicon layer over the OD region.

In step 930, a semiconductor fabrication tool (e.g., a stepper or scanner 104) performs a first lithographic process on the first layer over the first semiconductor wafer using a first inter-field correction and a first intra-field correction.

At step 932, an overlay error of the first lithographic process is determined. In some embodiments, overlay data are only measured for a small subset of the lots processed. For example in some embodiments, overlay data are only measured for one lot of every 10 lots processed.

At step 934, the controller computes a second inter-field correction and a second intra-field correction based on the first inter-field correction, the first intra-field correction, and the measured overlay error. A second lithographic process is performed on the second layer over the second semiconductor wafer, based on the second inter-field correction and the second intra-field correction.

In some embodiments, step 934 is performed recursively. For example, in some embodiments, the controller computes a third inter-field correction and a third intra-field correction based on the first and second inter-field corrections and the first and second intra-field corrections. The controller then causes the scanner to perform a third lithographic process on a second layer over a first layer over a third semiconductor wafer. The third intra-field correction can be applied to a third wafer, which can be included in a third lot of wafers. This process can be performed recursively for additional lots of wafers.

In some embodiments, the recursive computation of intra-field corrections for additional lots of wafers is performed recursively using an exponential weighted moving average of the intra-field corrections applied to all previous lots since (and including) the most recent previous lot for which intra-field overlay error data were measured. For example, in some embodiments, the third intra-field correction are computed using exponential weighted moving average of the first and second intra-field corrections.

Thus, to compute intra-field corrections for N lots of wafers using measured data from the first lot, the controller computes an Nth intra-field correction, where N is an integer greater than 2, based on intra-field corrections corresponding to respective second layers of a plurality of semiconductor wafers including the first semiconductor wafer, and an N−1th semiconductor wafer. The controller causes the scanner to perform a lithographic process on a second layer (over a first layer) over the Nth semiconductor wafer using the Nth intra-field correction. (Each of the N semiconductor wafers is included in a respectively different lot of semiconductor wafers.)

Figure 9B:
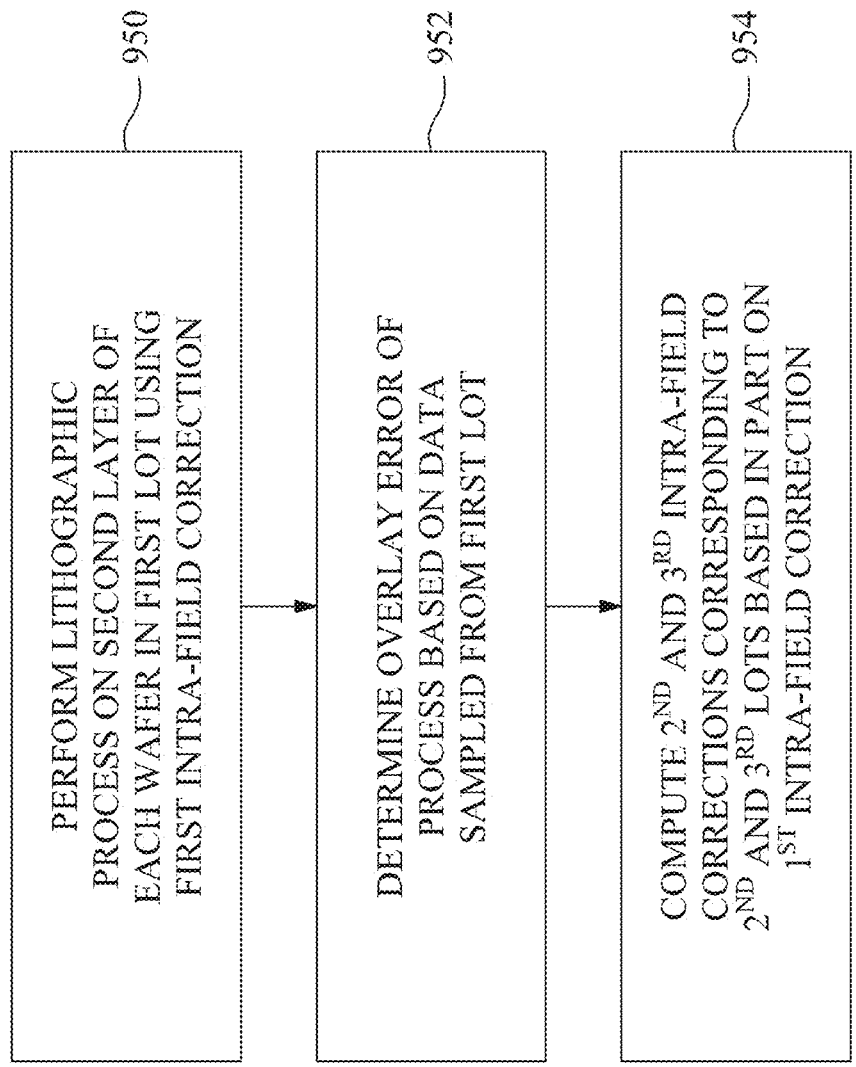
FIG. 9B is a flow chart of a method of computing intra-field correction, in accordance with some embodiments.

FIG. 9B shows another example of a method of processing at least three lots of wafers, using CPE modeling.

At step 950, the controller 1102 causes the tool (e.g., scanner) to perform the lithographic process on the second layer of each semiconductor wafer in the first lot using a first intra-field correction.

At step 952, the controller determines an overlay error of the lithographic process based on data sampled from the first lot.

At step 954, the controller computes at least two different intra-field corrections corresponding to at least two other respective lots within the plurality of lots based in part on the first intra-field correction. For example, in some embodiments, the overlay error data are only sampled form the first lot, and the controller computes a second intra-field correction for processing a second lot of wafers, and a third intra-field correction for processing a third lot of wafers based in part on the first intra-field correction.

Figure 9C:
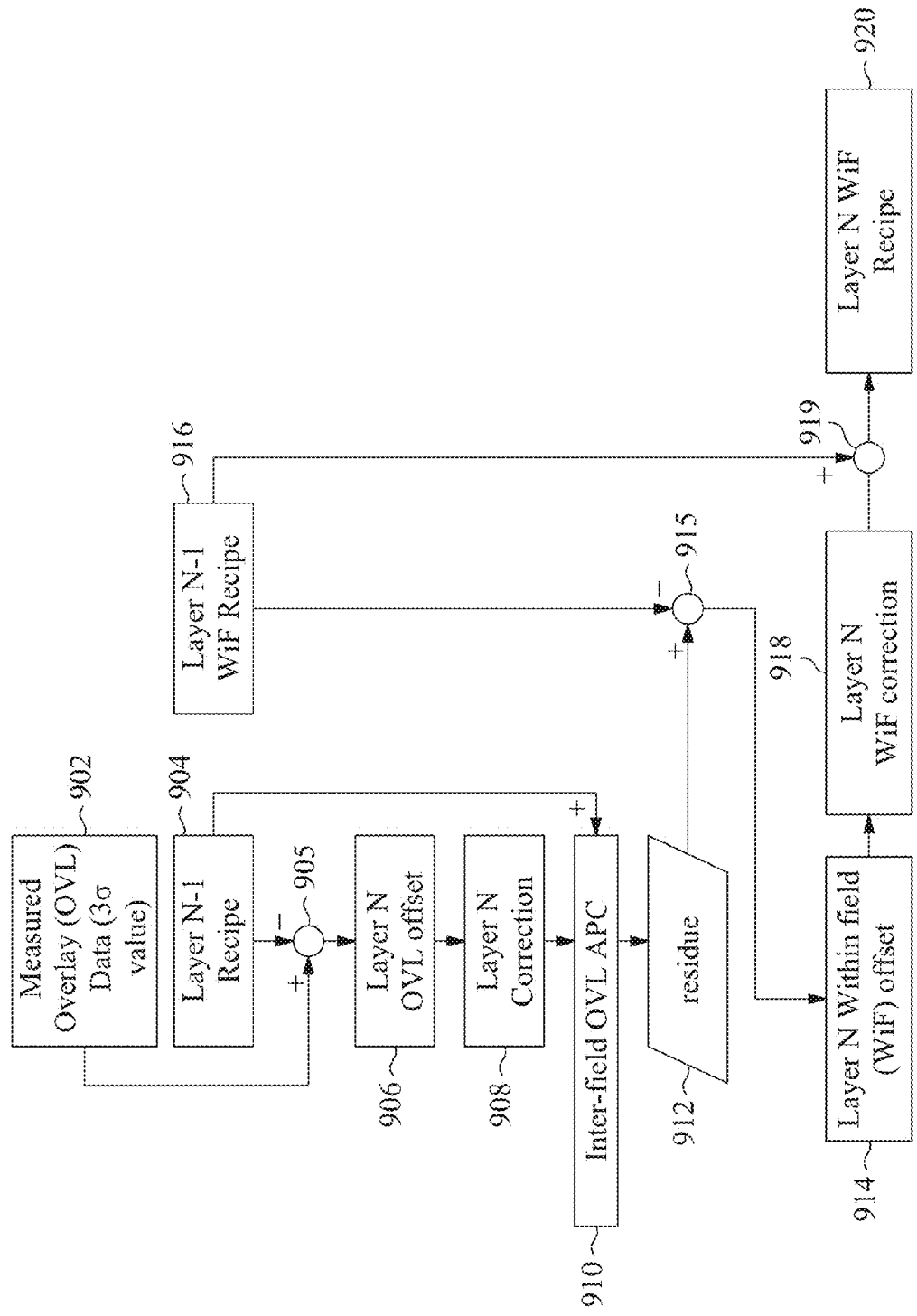
FIG. 9C is a flow chart of a method of computing inter-field and intra-field correction, in accordance with some embodiments.

FIG. 9C is a more detailed flow chart of a method of overlay control according to some embodiments of a method as shown in FIG. 9A or 9B. FIG. 9C refers to Layer N and Layer N−1. In FIG. 9C, layer N is the current layer for which intra-field corrections are currently being computed, in order to control the processing of the current layer of the current lot of wafers. Thus, N and N−1 have different values each time another layer is processed. In a non-limiting example, Layer N−1 can be the active region (oxide definition or OD region), and Layer N can be a polycrystalline silicon gate electrode layer.

At block 902, the overlay measurement data from the current layer are retrieved. These data can correspond to the lot currently being processed. In some embodiments, the overlay data include CD values for a large number of lines and patterns and/or coordinates specifying locations of edges, sufficient to identify a run-to-run error (inter-field offset). In some embodiments, the controller receives measurements of a plurality of values in each of a plurality of fields within at least one wafer within the first one of the plurality of lots, compares the measurements to respective target values, and computes a standard deviation ($\sigma$) of each of the plurality of values across the plurality of fields. In some embodiments, the 3$\sigma$ values are computed for each measurement.

At block 904, the "recipe" or control action used for processing layer N−1 (the most recent previous layer) is retrieved. In some embodiments, this "recipe" includes one or more of a translation, a rotation, a non-orthogonality (skew), and/or scaling.

At summing node 905, the controller computes a difference between the measured overlay data and the recipe for layer N−1, and outputs the difference to block 906. Each successive layer is aligned relative to the most recent previous layer, so a deviation between the measured data and the recipe of the most recent layer (N–1) identifies the overlay offset (alignment error) of Layer N relative to Layer N–1.

At block 906, the controller provides the Layer N overlay offset. In some embodiments, the overlay offset is an array or matrix of values corresponding to a plurality of measurement locations or CDs. Thus, the overlay offset can include different values at different locations within a wafer, or different locations within each field.

At block 908, the controller computes the current layer correction. This is the correction that would be applied to eliminate the average inter-field overlay offset.

At block 910, the controller computes the wafer to wafer (inter-field) overlay APC inter-field correction for the current layer N. This is the control action to be superimposed on the layer N–1 "recipe" to compensate for the inter-field offset.

At block 912, the residue is computed to separate the overlay error into an inter-field error and an intra-field error. The residue is the difference between the measurement and the target for each measured value. The controller subtracts measured intra-field data of the first semiconductor wafer in the first lot (or from a plurality of wafers in the first lot) from corresponding target intra-field data to provide a residue. In some embodiments, measured data values from a plurality of wafers in the first lot are used. The mean and standard deviation of the measured values are computed. The residue is an array containing the mean plus 3 standard deviations ($3\sigma$ value) for each point or parameter measured.

At block 916, the controller accesses the intra-field (within field, or WiF) recipe or control action used to pattern Layer N–1. For example, the controller thus subtracts the intra-field correction of the first lot from the residue to provide an intra-field offset of the pre-determined layer of the second lot.

In the summing node 915, the controller computes the difference between the residue 912 and the intra-field (WiF) recipe or control action used to pattern Layer N–1, and outputs the difference to block 914. The controller subtracts the first intra-field correction from the residue to provide an intra-field offset of the second layer of the second wafer.

At block 914, the controller provides the Layer N intra-field (WiF) offset computed at the summing node 915. This is a relative measure of the deviation of the Layer N data with inter-field correction from the Layer N–1 recipe (control action), which includes both inter-field and intra-field corrections. Thus, to the extent that the process subjected to the Layer N inter-field correction and the layer N–1 intra-field correction did not completely match the measured data, an additional control action can be computed. In some embodiments, the Layer N intra-field (WiF) offset 914 is expressed as a matrix of deviations (e.g., translation, non-orthogonality, and/or scaling).

At block 918, the layer N intra-field (WiF) correction is computed. In some embodiments, the Layer N intra-field (WiF) offset 914 is expressed as a matrix of deviations, and the Layer N intra-field (WiF) correction is computed by inverting the Layer N intra-field (WiF) offset matrix. For example, the controller computes an inverse of the intra-field offset of the second layer of the second wafer (from the second lot of wafers) to provide the second intra-field correction.

At summing node 919, the controller adds the Layer N intra-field (WiF) correction to the Layer N–1 intra-field (WiF) recipe (control action), and outputs the Layer N intra-field (WiF) recipe or control action. For example, the controller combines the second intra-field correction with the first intra-field correction to determine a control action used to process the second wafer.

At block 920, the controller executes the Layer N intra-field (WiF) recipe or control action.

Figure 10:
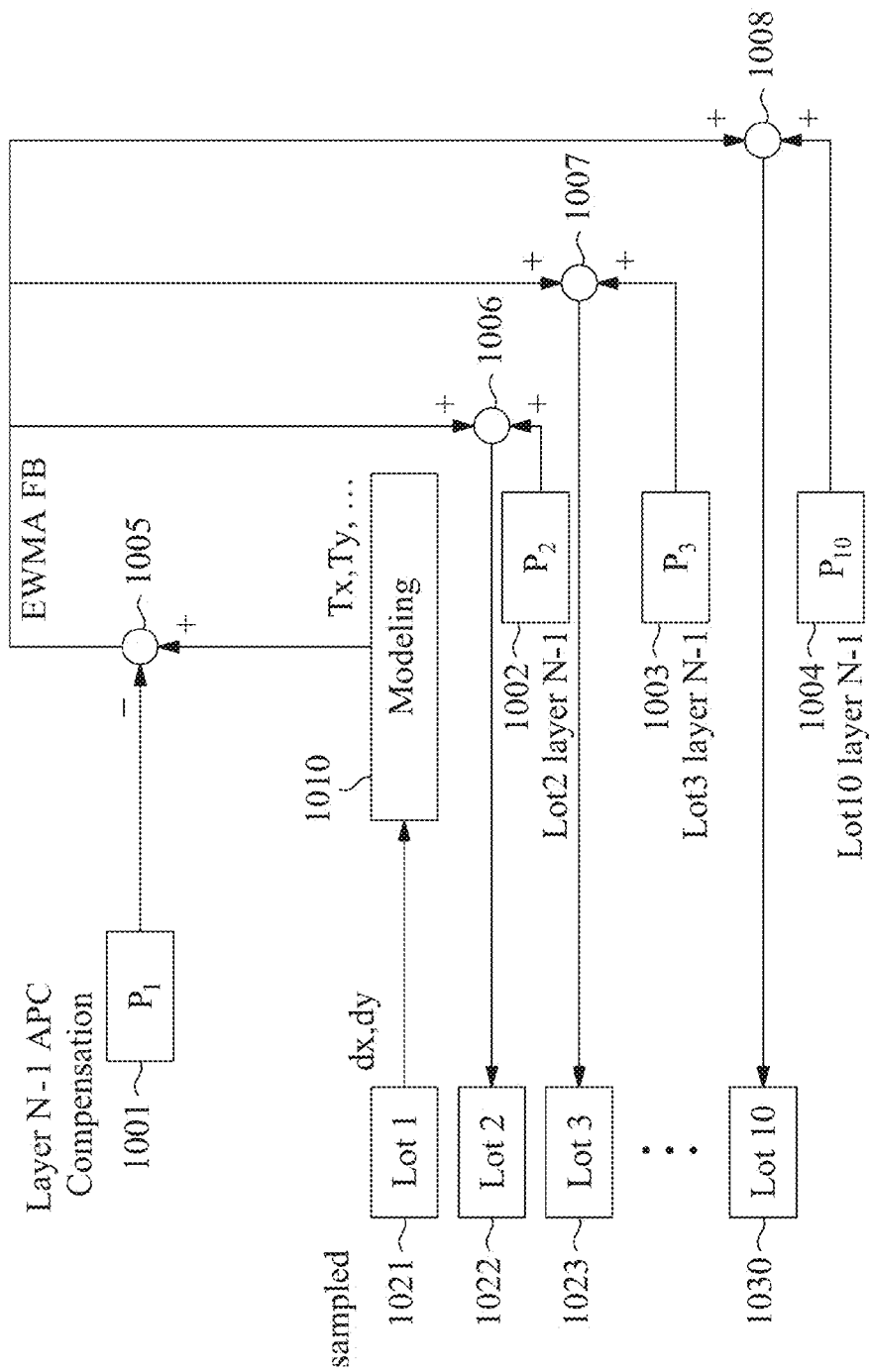
FIG. 10 is a block diagram showing the exponential weighted moving average method of computing intra-field corrections, in accordance with some embodiments.

FIG. 10 is a block diagram of a moving average method for computing the intra-field corrections for each lot and layer. Within a given lot, the intra-field correction for each layer (N) takes into account the intra-field correction of the previous layer (N–1) for wafers in the same lot. Also, the intra-field correction for any given layer in all of the wafers in any given lot takes into account a weighted average of the intra-field corrections applied to one or more previous lots.

In some embodiments, the moving average is an exponential weighted moving average (EWMA). The EWMA applies weighting factors which decrease exponentially. Thus, an EWMA provides an infinite impulse response filter The weighting for the intra-field corrections applied to each previous lot decreases exponentially. The EMA for a series Y may be calculated recursively:

In some embodiments, the weighting for the intra-field correction is calculated according to equation (1)

$$N>1, W_N = \alpha * Y_N + (1-\alpha) * W_{N-1}, \quad (1)$$

where $W_N$ is the weighted average intra-field correction for any lot N;

the coefficient $\alpha$ is a value between 0 and 1 representing the degree of weighting decrease. The larger the value of $\alpha$, the less weight is given to the corrections applied to previous lots; and $Y_N$ is the current layer WiF correction relative to the previous layer.

In some embodiments, the overlay errors are measured periodically (e.g., every 10 or 20 lots), and the EWMA is computed so as to take account of the most recent lot for which overlay errors are measured and each intervening lot since the measurement. For example, in FIG. 10, the overlay error data are sampled for lot 1 and are not sampled again for lots 2 through 10.

Referring to FIG. 10, at block 1021, overlay error data dx, dy are sampled for Lot No. 1.

In block 1010, a model is applied to compute the control action (Tx, Ty) for lot 1.

at block 1001, the Layer N–1 APC compensation (inter-field correction plus intra-field correction) is provided to summing node 1005.

At summing node 1005, the controller subtracts the Layer N–1 APC compensation) is subtracted from the computed control action Tx, Ty for lot 1. The result is EWMA feedback (FB) that the controller uses to compute each subsequent intra-field correction. For example, the EWMA FB is provided to summing nodes 1006, 1007 and 1008.

At block 1002, the previous layer APC compensation for layer N–1 of lot 2 is provided to summing node 1006.

At summing node 1006, the EWMA FB from node 1005 is combined with the previous layer APC compensation for layer N–1 of lot 2 to compute the APC compensation for layer N of lot 2. For example, in some embodiments, the feedback from Node 1005 is multiplied by a coefficient $(1-\alpha)$, where $0 \leq \alpha \leq 1$, and then added to the previous layer APC compensation for layer N–1 of lot 2. The resulting APC compensation is applied to Layer N of the wafers of lot 2 (1022).

At block 1003, the previous layer APC compensation for layer N–1 of lot 1 is provided to summing node 1007.

At summing node 1007, the EWMA FB from node 1005 is combined with the previous layer APC compensation for layer N–1 of lot 3 to compute the APC compensation for layer N of lot 3. For example, in some embodiments, the feedback from Node 1005 is multiplied by a coefficient $(1-\alpha)2$, and then added to the previous layer APC compensation for layer N−1 of lot 3. The resulting APC compensation is applied to Layer N of the wafers of lot 3 (1023).

At block 1004, the previous layer APC compensation for layer N−1 of lot 1 is provided to summing node 1008.

At summing node 1008, the EWMA FB from node 1005 is combined with the previous layer APC compensation for layer N−1 of lot 10 to compute the APC compensation for layer N of lot 10. For example, in some embodiments, the feedback from Node 1005 is multiplied by a coefficient $(1-\alpha)10$, and then added to the previous layer APC compensation for layer N−1 of lot. The resulting APC compensation is applied to Layer N of the wafers of lot 10 (1030).

In other embodiments, other forms of averaging are used. For example, in some embodiments, the average can be an arithmetic mean of the values from previous lots, instead of the EWMA. In other embodiments, a weight of zero can be assigned to older lots beyond a certain number, regardless of when the most recent overlay error measurement was taken. For example, the current Intra-field correction can take into account the intra-field correction applied to the most recent five or ten lots, but not older lots.

Figure 11:
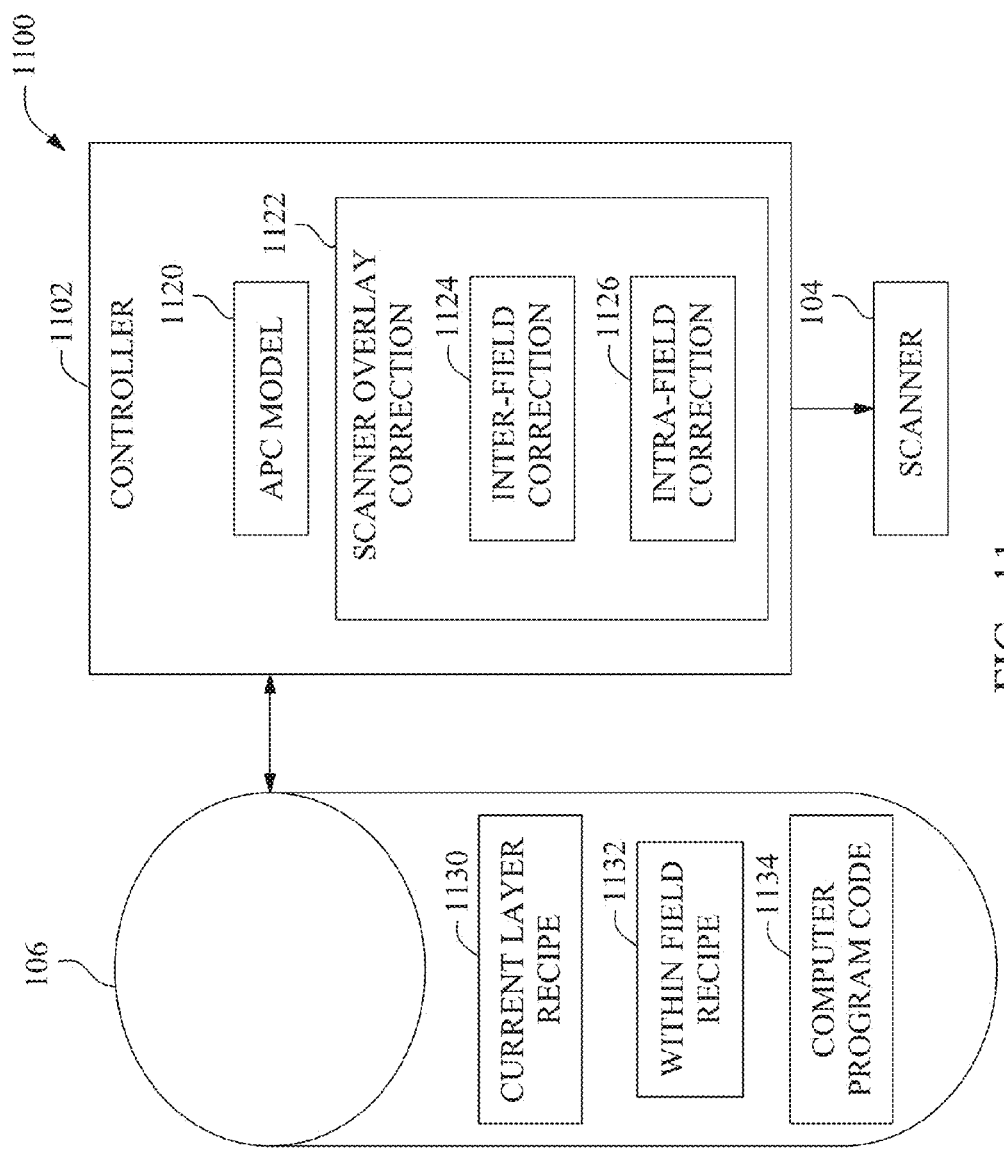
FIG. 11 is a block diagram of a computer implemented controller for a stepper (e.g., scanner), in accordance with some embodiments.

FIG. 11 is a block diagram of a system 1100 for overlay intra-field APC for processing a plurality of lots of semiconductor wafers. Each lot has a plurality of semiconductor wafers. Each semiconductor wafer has a first layer thereon and a second layer over the first layer.

The system 1100 has at least one semiconductor fabrication tool 104 configured to perform a lithographic process on the semiconductor wafers. In some embodiments, the tool is a stepper. In some embodiments, the tool is a scanner 104.

The system 1100 has a controller 1102 for controlling the semiconductor fabrication tool 104. The controller can be implemented using a processor that executes specialized computer program code to control and operate the scanner 104, and process the data from the scanner. In other embodiments, the controller is implemented using special purpose hardware.

The system 1100 has a machine readable storage medium 106 encoded with computer program code 1134, such that when the computer program code is executed by a processor of controller 1102, the processor controls a semiconductor fabrication tool 104.

The controller 1102 includes an APC model 1120 for adjusting one or more parameters of the semiconductor fabrication process to correct scanner overlay errors, which can be defined by the manufacturer of the scanner. The overlay correction model can be similar to the model described above with reference to FIGS. 2A to 2H.

The controller 1102 further includes scanner overlay correction functions 1122. The scanner overlay correction functions 1122 includes an inter-field correction module 1124, and an intra-field correction module 1126.

In some embodiments, the inter-field correction module 1124 performs the functions described above with respect to blocks 902-912 of FIG. 9C.

In some embodiments, the intra-field correction module 1126 performs the functions described above with respect to blocks 914-920 of FIG. 9C. In some embodiments, the intra-field correction module 1126 uses an averaging method such as that described above with reference to FIG. 10. In some embodiments, the intra-field correction module 1126 uses an averaging method such as EWMA.

Thus, a method and controller as described herein compute the intra-field correction for each lot in part based on the inter-field correction and intra-field correction corresponding to a layer adjacent to the pre-determined layer in each one of the lots that has already been processed by the semiconductor fabrication tool. The method provides feedforward control and a model-based controller for overlay correction per exposure (CPE).

The method described herein provides a more accurate model of the intra-field overlay behavior in immersion lithography, compensating for variations in the inter-field positions due to, e.g., chuck cooling effects. The system models intra-field parameters that are not constant over wafer. The modeled intra-field corrections vary over the wafer and over time to meet the conditions of immersion lithography. The system can compensate for intra-field overlay behavior due to noise from previously deposited layers and random disturbances.

In some embodiments, a method of processing first and second semiconductor wafers is provided. Each of the first and second semiconductor wafers has a first layer thereon and a second layer over the first layer. A first lithographic process is performed on the first layer over the first semiconductor wafer using a first inter-field correction and a first intra-field correction. An overlay error of the first lithographic process is determined. A second inter-field correction and a second intra-field correction are computed based on the first inter-field correction, the first intra-field correction, and the measured overlay error. A second lithographic process is performed on the second layer over the second semiconductor wafer, based on the second inter-field correction and the second intra-field correction.

In some embodiments, a system is provided for processing a plurality of lots of semiconductor wafers, each lot having a plurality of semiconductor wafers. Each semiconductor wafer haw a first layer thereon and a second layer over the first layer. At least one semiconductor fabrication tool is configured to perform a lithographic process on the semiconductor wafers. A controller is provided for adjusting one or more parameters of the semiconductor fabrication tool, the controller configured for: causing the tool to perform the lithographic process on the second layer of each semiconductor wafer in the first lot using a first intra-field correction; determining an overlay error of the lithographic process based on data sampled from the first lot; and computing at least two different intra-field corrections corresponding to at least two other respective lots within the plurality of lots based in part on the first intra-field correction.

In some embodiments, a non-transitory machine readable storage medium encoded with computer program code, such that when the computer program code is executed by a processor, the processor controls a semiconductor fabrication tool such that the processor causes the semiconductor fabrication tool to perform a lithographic process on a pre-determined layer over each wafer in at least first, second and third lots of semiconductor wafers. The processor computes an intra-field correction of semiconductor wafers in the first lot based on measurement data from the first lot. The processor computes respectively different intra-field corrections for each respective one of the second and third lots of wafers, the intra-field correction of the second lot based in part on the intra-field correction of the first lot, the intra-field correction of the third lot based in part on the intra-field correction of the first lot and the intra-field correction of the second lot, the second and third intra-field corrections being applied to perform the lithographic process on the second and third lots, respectively.

The methods and system described herein may be at least partially embodied in the form of computer-implemented processes and apparatus for practicing those processes. The disclosed methods may also be at least partially embodied in the form of tangible, non-transient machine readable storage media encoded with computer program code. The media may include, for example, RAMs, ROMs, CD-ROMs, DVD-ROMs, BD-ROMs, hard disk drives, flash memories, or any other non-transient machine-readable storage medium, wherein, when the computer program code is loaded into and executed by a computer, the computer becomes an apparatus for practicing the method. The methods may also be at least partially embodied in the form of a computer into which computer program code is loaded and/or executed, such that, the computer becomes a special purpose computer for practicing the methods. When implemented on a general-purpose processor, the computer program code segments configure the processor to create specific logic circuits. The methods may alternatively be at least partially embodied in a digital signal processor formed of application specific integrated circuits for performing the methods.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein.

Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of processing first and second semiconductor wafers, each having a first layer thereon and a second layer over the first layer, the method comprising:
    performing a first lithographic process on the first layer over the first semiconductor wafer using a first inter-field correction and a first intra-field correction;
    determining an overlay error of the first lithographic process;
    computing a second inter-field correction and a second intra-field correction based on the first inter-field correction, the first intra-field correction, and the measured overlay error;
    performing a second lithographic process on the second layer over the second semiconductor wafer, based on the second inter-field correction and the second intra-field correction.

2. The method of claim 1, further comprising
    computing a third inter-field correction and a third intra-field correction based on the first and second inter-field corrections and the first and second intra-field corrections; and
    performing a third lithographic process on a second layer over a first layer over a third semiconductor wafer.

3. The method of claim 2, wherein the third intra-field correction is computed using exponential weighted moving average of the first and second intra-field corrections.

4. The method of claim 1, wherein the computing step includes:
    subtracting measured data of the first semiconductor wafer from corresponding target data to provide a residue; and
    subtracting the first intra-field correction from the residue to provide an intra-field offset of the second layer of the second wafer.

5. The method of claim 4, wherein the computing step further includes:
    computing an inverse of the intra-field offset of the second layer of the second wafer to provide the second intra-field correction.

6. The method of claim 5, further comprising combining the second intra-field correction with the first intra-field correction to determine a control action used to process the second wafer.

7. The method of claim 1, further comprising
    computing an Nth intra-field correction, where N is an integer greater than 2, based on intra-field corrections corresponding to respective second layers of a plurality of semiconductor wafers including the first semiconductor wafer, and an N−1th semiconductor wafer; and
    performing a lithographic process on a second layer over a first layer over the Nth semiconductor wafer using the Nth intra-field correction.

8. The method of claim 7, wherein each of the plurality of semiconductor wafers is included in a respectively different lot of semiconductor wafers.

9. A method for processing a plurality of lots of semiconductor wafers, each lot having a plurality of semiconductor wafers, each semiconductor wafer having a first layer thereon and a second layer over the first layer, the method comprising:
    performing a lithographic process on the semiconductor wafers using at least one semiconductor fabrication tool;
    adjusting one or more parameters of the semiconductor fabrication tool, the controller configured for:
    performing the lithographic process on the second layer of each semiconductor wafer in the first lot using a first intra-field correction;
    determining an overlay error of the lithographic process based on data sampled from the first lot; and
    computing at least two different intra-field corrections corresponding to at least two other respective lots within the plurality of lots based in part on the first intra-field correction.

10. The method of claim 9, wherein the computing step uses an exponential weighted moving average of intra-field corrections for each completed one of the plurality of lots to compute an intra-field correction to be used for performing the lithographic process on a next one of the plurality of lots.

11. The method of claim 9, wherein the semiconductor fabrication tool is a scanner.

12. The method of claim 9, wherein determining the overlay error includes:
    receiving measurements of a plurality of values in each of a plurality of fields within at least one wafer within the first one of the plurality of lots;
    comparing the measurements to respective target values;
    computing a standard deviation of each of the plurality of values across the plurality of fields.

13. The method of claim 12, wherein determining the overlay error further includes computing a residue array, such that each value in the residue array is three times the standard deviation of a respective one of the plurality of values.

14. The method of claim 9, wherein:

the method further comprises separating the overlay error into an inter-field error and an intra-field error, the step of causing the tool to perform the lithographic process on the second layer includes applying an inter-field correction, and the at least two different intra-field corrections are based in part on the intra-field error.

15. A method comprising:

performing a lithographic process on a pre-determined layer over each wafer in at least first, second and third lots of semiconductor wafers;

computing an intra-field correction of semiconductor wafers in the first lot based on measurement data from the first lot; and computing respectively different intra-field corrections for each respective one of the second and third lots of wafers, the intra-field correction of the second lot based in part on the intra-field correction of the first lot, the intra-field correction of the third lot based in part on the intra-field correction of the first lot and the intra-field correction of the second lot, the second and third intra-field corrections being applied to perform the lithographic process on the second and third lots, respectively.

16. The method of claim 15, wherein the third intra-field correction is computed using an exponential weighted moving average of the first and second intra-field corrections.

17. The method of claim 15, wherein the lithographic tool processes one or more additional lots of semiconductor wafers using a respectively different additional intra-field correction for each additional lot, and each of the additional intra-field corrections is based in part on each respective one of the intra-field corrections applied in processing each previously processed lot of semiconductor wafers among the first, second, third and additional lots.

18. The method of claim 15, wherein the method includes:

subtracting the measurement data of the first lot from corresponding target intra-field data to provide a residue;

subtracting the intra-field correction of the first lot from the residue to provide an intra-field offset of the pre-determined layer of the second lot;

computing an inverse of the intra-field offset of the pre-determined layer of the second lot to provide the second intra-field correction; and combining the second intra-field correction to the first intra-field correction to determine a control action used to process the second lot.

19. The method of claim 15, the method comprises computing an overlay error based on the measurement data, and dividing the overlay error into the intra-field error and an inter-field error.

20. The method of claim 19, wherein:

the method comprises computing an inter-field correction for each of the lots; and the intra-field correction for each lot is in part based on the inter-field correction and intra-field correction corresponding to a layer adjacent to the pre-determined layer in each one of the lots that has already been processed by the semiconductor fabrication tool.

* * * * *